US008017070B2

(12) United States Patent
Low et al.

(10) Patent No.: US 8,017,070 B2
(45) Date of Patent: Sep. 13, 2011

(54) DIRECT TO METAL SINTERING OF 17-4PH STEEL

(75) Inventors: Steven C. Low, Mesa, AZ (US); Jerry G. Clark, Queen Creek, AZ (US); Neal W Muylaert, Apache Junction, AZ (US); Richard J. Nord, Scottsdale, AZ (US); Blair E. Thompson, Scottsdale, AZ (US); Bryan E. Ake, Gilbert, AZ (US); Reid W. Williams, Mesa, AZ (US)

(73) Assignee: The Boeing Company, Chicago, IL (US)

( * ) Notice: Subject to any disclaimer, the term of this patent is extended or adjusted under 35 U.S.C. 154(b) by 734 days.

(21) Appl. No.: 11/749,864

(22) Filed: May 17, 2007

(65) Prior Publication Data
US 2009/0208361 A1   Aug. 20, 2009

(51) Int. Cl.
*B22F 1/00* (2006.01)
(52) U.S. Cl. ............... 419/26; 419/31; 419/38; 420/60
(58) Field of Classification Search .............. 419/26
See application file for complete search history.

(56) References Cited

U.S. PATENT DOCUMENTS

| 4,849,164 A * | 7/1989 | Jandeska et al. ............ 419/11 |
| 5,745,834 A | 4/1998 | Bampton et al. |
| 6,355,211 B1 | 3/2002 | Huang |
| 6,770,114 B2 | 8/2004 | Bartone et al. |
| 7,034,246 B2 | 4/2006 | Muylaert et al. |
| 2002/0176793 A1 | 11/2002 | Moussa et al. |
| 2004/0182202 A1 | 9/2004 | Geving et al. |

FOREIGN PATENT DOCUMENTS
WO  WO 02092264 A1 * 11/2002

OTHER PUBLICATIONS

E Klar and P.K. Samal, "Sintering of Stainless Steel," ASM Handbook Online, vol. 7, (2002).*
EOS StainlessSteel 17-4 for EOSINT M 270 (provisional data) (2006).*

* cited by examiner

*Primary Examiner* — Roy King
*Assistant Examiner* — Christopher Kessler
(74) *Attorney, Agent, or Firm* — McNees Wallace & Nurick LLC

(57) ABSTRACT

A method of sintering a 17-4PH alloy powder and a sintered 17-4PH sintered part are disclosed. The part is formed by selective laser sintering a 17-4PH alloy powder and binder mixture to form a green part that is sintered to form a part having a substantially pure martensitic structure. The metal powder includes boron. The sintered part may be further processed by shot peening to improve crack resistance.

7 Claims, 8 Drawing Sheets

|  | DtMS 17-4 CRES Mechanical Properties as Sintered | DtMS 17-4 CRES Example |
|---|---|---|
| Density, g/cm$^3$ | > 7.5 | 7.5 |
| UTS ksi | > 140 | 143 |
| YS ksi | > 80 | 83 |
| Elongation | > 6% | 6.2 |
| Fatigue life (R=0.1) |  |  |
| Cycles @ 40 ksi | 10 x 10$^6$ | 10 x 10$^6$ |
| @ 70 ksi | > 175,000 | 175,000 |
| @ 85 ksi | > 71,000 | 71,000 |

FIG. 5

| Boron % | Width | Thk | Area | Yield Load | Yield Stress | Ult Load | Tens Strength | Modulus | Elong |
|---|---|---|---|---|---|---|---|---|---|
| 0 | 0.422 | 0.127 | 0.054 | 3514.6 | 65.6 | 5666.8 | 105.7 | 7.062 | 5.015 |
| 0 | 0.425 | 0.13 | 0.055 | 3385.4 | 61.3 | 5645.3 | 102.2 | 6.744 | 5.133 |
| 0.1 | 0.418 | 0.118 | 0.049 | 4112.8 | 83.4 | 7096 | 143.9 | 9.022 | 6.606 |
| 0.1 | 0.414 | 0.12 | 0.05 | 4310.6 | 86.8 | 7109.6 | 143.1 | 8.812 | 6.244 |
| 0.2 | 0.415 | 0.122 | 0.051 | 4125.9 | 81.5 | 7514.1 | 148.4 | 8.002 | 4.81 |
| 0.2 | 0.419 | 0.12 | 0.05 | 4137.5 | 82.3 | 7429 | 147.8 | 9.196 | 4.592 |
| 0.3 | 0.403 | 0.132 | 0.053 | 4254.9 | 80 | 7454.6 | 140.1 | 8.255 | 4.342 |
| 0.3 | 0.404 | 0.135 | 0.055 | 4415.9 | 81 | 7594.6 | 139.2 | 8.5 | 3.755 |

FIG. 6

DIRECT TO METAL SINTERING OF 17-4PH STEEL

FIELD OF THE INVENTION

This invention relates generally to selective laser sintering and, more particularly, to methods and articles formed by selective laser sintering of a corrosion resistant steel.

BACKGROUND OF THE INVENTION

Rapid prototyping technology provides designers of complex parts a fast and flexible means by which to fabricate parts, often prototypes or test parts of low quantity, for which it would not be practical to form by a cast mold production method. Selective laser sintering (SLS) is among the most common commercial available rapid prototyping technologies that fabricates a part by layer-by-layer powder deposition.

SLS can be performed on a variety of materials including, but not limited to metals, cermets, ceramics and many polymers. A powder of the part material is mixed with a binder material and distributed on a surface. Thereafter, a laser is applied to the powder layer so as to melt the binder material. As the laser moves in a pattern over the layer, the melted binder solidifies and fuses together with the powder. The laser pattern is controlled to form a layer having a desired shape of the part. Additional layers of powder and binder are treated in the same manner to form the desired part in a layer-by-layer fabrication. At this stage, the part containing the binder is referred to as a green part.

After the green part is formed by the SLS process, the part is transferred to a furnace where the binder is removed and the powder is lightly sintered together. The part is then referred to as a brown part. The brown part is further heated to further sinter the powder together until the final part is formed. The final part may be further treated to improve part characteristics.

The properties of the final part are determined by the selection of the powder composition and fabrication parameters. Up to this time, no fabrication technique has been developed to form a corrosion resistant part from a ferrous material that can be treated to develop a wide range of properties.

SUMMARY OF THE INVENTION

A high strength, corrosion resistant ferrous based part and method of fabricating the part by a free form fabrication process are disclosed herein. The process includes selective laser sintering of a metal powder and binder mixture to form a green part using computer aided design (CAD) data. The green part is then sintered to form the final part, which may be further processed.

A first embodiment of the invention for sintering a powder includes mixing binder powder and metal powder to form a powder mixture, selectively sintering the powder mixture to form a green part comprising a binder constituent, heating the green part to remove the binder constituent and form a brown part, cooling the brown part to ambient temperature, and sintering the brown part to form a sintered metal part, wherein the metal powder comprises 17-4PH alloy powder. The first embodiment further includes selective laser sintering using a laser having a power in the range of about 10 W and about 35 W.

The first embodiment also includes using a metal powder having between approximately 0.1% and 0.3% boron, and more specifically wherein the metal powder includes approximately 0.1% boron. The first embodiment also includes having a powder mixture containing approximately 1.0% binder powder. The first embodiment additionally includes the metal powder having a composition of approximately 15.5-17.5% Cr, 3.5-4.5% Ni, 3.5-4.5% Cu, 0.15-0.45% Cb+Ta, 0-0.5% Mn, 0-0.04 P, 0.07% max C, and balance Fe.

Another embodiment of the invention includes a sintered part having a composition of approximately 15.5-17.5% Cr, 3.5-4.5% Ni, 3.5-4.5% Cu, 0.15-0.45% Cb+Ta, 0.1%-0.3% B, 0-0.5% Mn, 0-0.04 P, 0.07% max C, and balance Fe. This embodiment further includes a boron amount of approximately 0.1%. The embodiment further discloses that the sintered part is a steel part having a substantially pure martensitic structure. The embodiment additionally includes wherein the steel part is formed having a density of greater than 7.5 g/cm³.

In yet another embodiment of the invention, a sintered part is formed by the method including mixing binder powder and metal powder to form a powder mixture, selectively sintering the powder mixture to form a green part including a binder constituent, heating the green part to remove the binder constituent and form a brown part, cooling the green part to ambient temperature, and sintering the brown part to form a sintered metal part, wherein the metal powder comprises 17-4PH alloy powder.

This embodiment further includes a metal powder having between approximately 0.1% and 0.3% boron, and more particularly, wherein the metal powder includes approximately 0.1% boron. This embodiment additionally includes wherein the metal powder is formed into a sintered part having a density of greater than 7.5 g/cm³, and wherein the sintered part has a substantially pure martensitic structure. This embodiment further includes the powder mixture having approximately 1.0% binder powder, and wherein metal powder has a composition including approximately 15.5-17.5% Cr, 3.5-4.5% Ni, 3.5-4.5% Cu, 0.15-0.45% Cb+Ta, 0-0.5% Mn, 0-0.04 P, 0.07% max C, and balance Fe. This embodiment also includes selective laser sintering by a laser having a power in the range of about 10 W to about 35 W.

Further aspects of the method and apparatus are disclosed herein. Other features and advantages of the present invention will be apparent from the following more detailed description of the preferred embodiment, taken in conjunction with the accompanying drawings that illustrate, by way of example, the principles of the invention.

BRIEF DESCRIPTION OF THE DRAWINGS

FIG. 5 shows characteristics of a sintered 17-4PH part.

FIG. 6 shows a comparison of effect of boron concentration

DETAILED DESCRIPTION OF THE INVENTION

Figure 1:
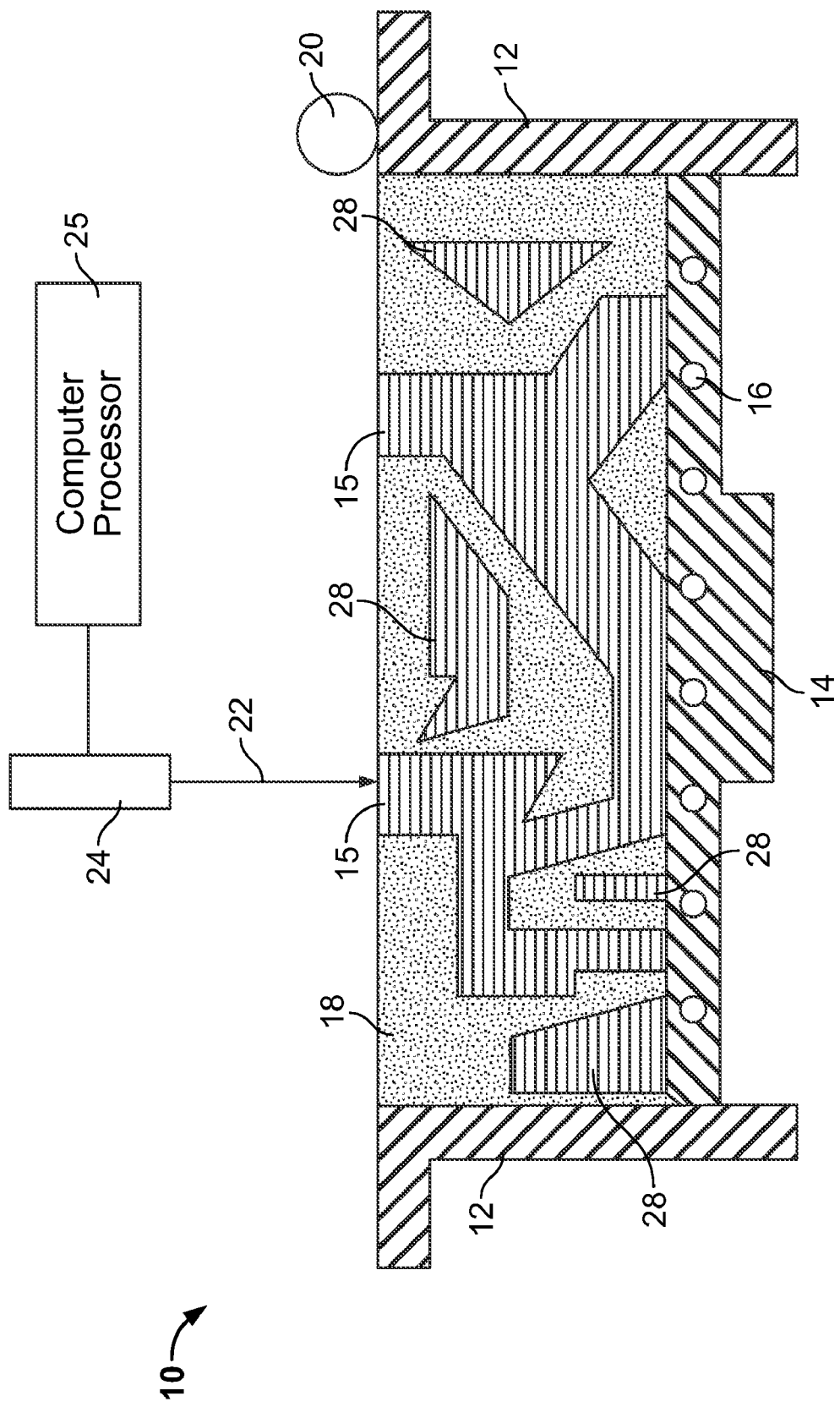
FIG. 1 shows a side sectional view of a prior art SLS apparatus

The present invention now will be described more fully hereinafter with reference to the accompanying drawing, in which a preferred embodiment of the invention is shown. This invention may, however, be embodied in many different forms and should not be construed as limited to the embodiments set forth herein; rather, these embodiments are provided so that this disclosure will be thorough and complete and will fully convey the scope of the invention to those skilled in the art. All composition percents are given as weight percents, unless otherwise specified.

The present invention is directed to a method of free form fabrication of a metallic component from a powder by selective laser sintering followed by furnace sintering to form a desired net shaped or near net shaped part. The method, which may use computer aided design (CAD) data, has utility for rapid production of complex shaped metal prototypes and for complete small batch production runs of high cost components or dies without the need for special tooling or machining operations.

The initial powder mixture includes a metal powder and a binder. The metal powder may be a single powder that substantially forms the composition of the sintered part, or the metal powder may be a blend of powders that collectively substantially form the final composition of the sintered part. The metal powder size is generally in the range of about 1-55 microns, and preferably in the range of 25-55 microns. The metal powder may be a single powder size distribution, or may be formed of a combination of powder size distributions. For example, the metal powder may be formed of two metal powders having different compositions but both having the same average particle size. For example, the metal powder may be formed of a first metal powder and a second metal powder, both having an average powder size of 44 microns. Alternatively, the metal powder may be formed of a first metal powder and a second metal powder having different average powder size.

The metal powder may be a stainless steel alloy powder composition, and particularly, may be a 17-4PH alloy steel powder. The 17-4PH alloy composition includes the following approximate weight percents: Cr=15.5-17.5%, Ni=3.5-4.5%, Cu=3.5-4.5%, Nb+Ta=0.15-0.45%, Si=0-0.5, Mn=0-0.5, P=0-0.04, C=0.07% max, and Fe balance. The 17-4PH alloy delivers the corrosion resistance of a 304 austenitic stainless steel, yet is as strong as 420 martensitic stainless. The metal powders may be formed by any known conventional method in the art, for example, molten spraying.

The metal powder includes a sintering aid. Rapidly diffusing boron is added to the metal powder in an amount of about 0.1% to less than 0.3% total metal powder weight to improve pore structure by forming more spherical pore shapes within the sintered body. In one example, boron in an amount of approximately 0.15% provided improved spherical pore shape in the resultant sintered body. If more than one powder is used to form the alloy, the boron may be added to only one metal powder, or the boron may be added to more than one or all of the powders forming the alloy. For example, a first metal powder having a 17-4PH composition may be mixed with a second metal powder having a 17-4PHB. The 17-4PHB composition is a 17-4PH composition alloyed with boron to form a total powder alloy mixture having a total boron amount from about 0.1% to less than 0.3% total metal powder weight.

The binder may be a thermoplastic polymer powder, more particularly a polyamide nylon, and most particularly may be a polyamide powder of nylon 12 such as OGRASOL® Nylon 12 by Arkema of Paris, France. The binder is provided in an amount of between about 1% and about 3% by weight of the total powder mixture. A binder amount of about 1% is preferred. The binder has an average powder size of about 4 microns. The binder may be added as a separate powder to the alloy powder mixture, or the binder may be coated on the metal powder. In one example, the binder is coated upon a 17-4PH powder and mixed with a non-coated 17-4PHB powder to form the total powder mixture.

A SLS process as is known in the art is shown in FIG. 1. FIG. 1 shows a side cross-sectional view of an SLS apparatus 10 and a part 15 undergoing fabrication. The SLS apparatus 10 includes side walls 12 and a platform or table 14. The table 14 may be constructed to descend incrementally within walls 12 to form a cavity for containing a powder mixture 18 to be sintered. A powder spreader 20 may be positioned on apparatus for spreading measured layers of powder mixture 18 atop table 14 within the sintering cavity.

Powder mixture 18 is used in the present process to build up a preform shape of the desired part 15. The powder mixture 18 contains a metal powder for forming the final alloy composition of the part 15 and a binder powder. The powder spreader 20 is used to spread a thin layer of approximately 0.001 inch to 0.020 inch of powder mixture 18 atop table 14, which is initially positioned just below the top of walls 12. Table 14 may be heated with coils 16 to bring the temperature of the powder mixture 18 to a desired level below the melting point of the polymer binder constituent. A beam 22 from a laser 24 is scanned over the layer of powder mixture 18. The beam 22 may be directed by a computer processor 25 having a computer aided design (CAD) data file for part 15 so as to perform selective laser sintering of powder mixture 18. The function of the beam 22, as directed by the processor 25, is to provide precise, localized heating of powder mixture 18. Preferably, beam 22 is provided by a laser in the infrared or near infrared region, although any focused beam of energy that is sufficiently intense to generate precise, localized heating may be used. A beam 22 having a power in the range of about 10 W to about 35 W may be used, and a beam having a power of 15 W being preferred.

The SLS process causes localized melting of the polymer constituent of a layer of powder mixture 18 as it is scanned by laser beam 22. The melted polymer rapidly resolidifies to bind the metal powder of the powder mixture 18 with connecting necks or bridges between metal powders. After laser beam 22 has completed scanning a layer of powder mixture 18, the table 14 is lowered a predetermined increment, a new layer of power mixture 18 is spread atop the previous layer, and the SLS process is repeated to build up part 15 layer-by-layer according to the design plan provided by computer processor 25. Part 15 is known in the art as a green part. The part 15 may be formed by alternative SLS processes.

After the green part 15 is formed by SLS, the green part 15 is removed from the SLS apparatus 10 and placed in a sintering furnace. The sintering furnace is preferably a vacuum furnace, and the source of heat may be resistance, microwave, ultrasonic or other conventional heating method as is known in the art. The sintering furnace is heated to first remove the binder and then to sinter the metal powder to form a net shape or near net shape part. The heating may be performed as a single or dual cycle heating process. The sintered part may then be subjected to secondary operations.

Figure 2:
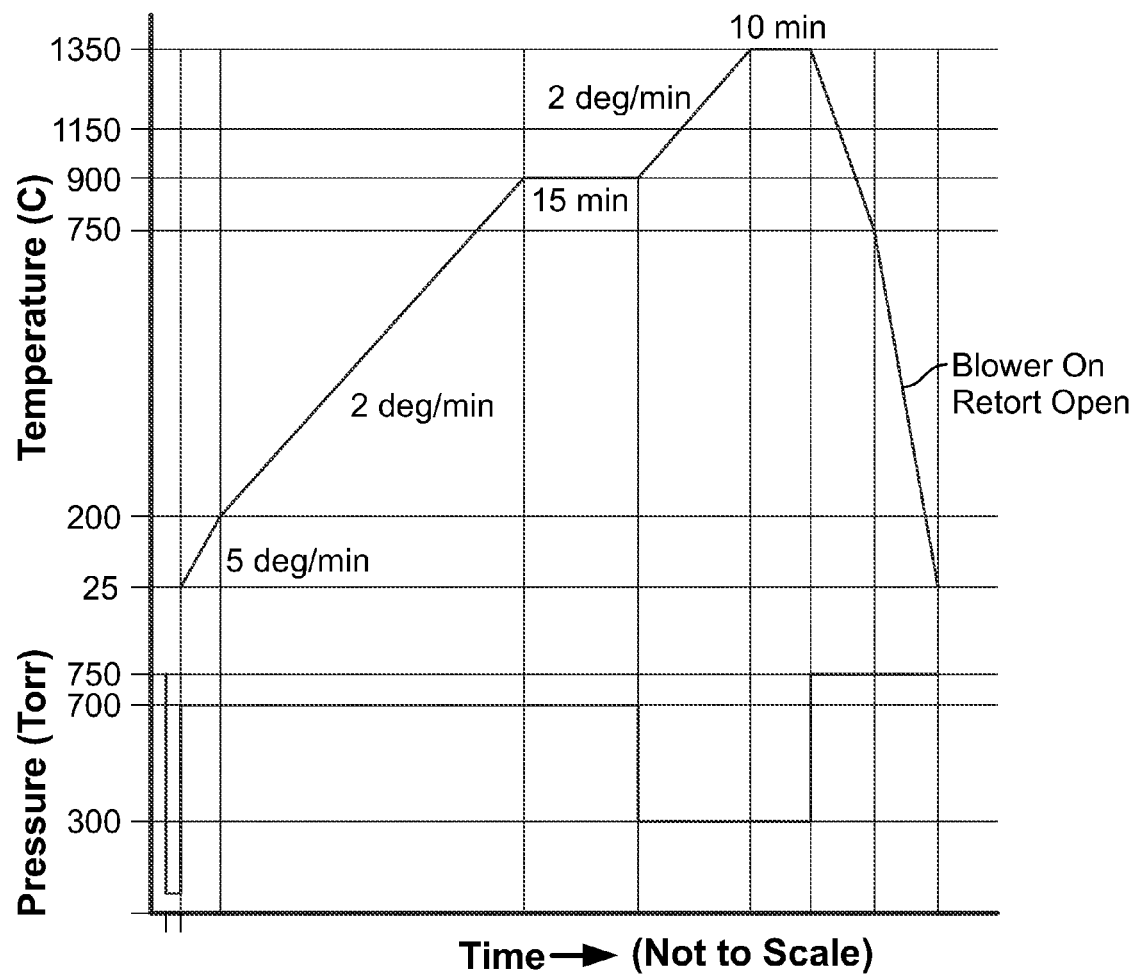
FIG. 2 illustrates an exemplary temperature and pressure profile for a single cycle process.

An exemplary single cycle sintering process is shown in FIG. 2. The process may be performed on parts that are supported by support media. The support media may be casting sand, boron-nitride or other ceramic or known media in the art. Alternatively, the process may be performed on parts that are not supported by support media.

As shown in FIG. 2, the first step of the sintering process includes evacuating the furnace and back-filling with argon to approximately 700 torr. The second step includes heating the furnace to about 200° C. at a rate of about 5° C./min. The third step includes heating from about 200° C. to about 900° C. at a rate of about 2° C./min. The furnace is then maintained at about 900° C. for about 15 minutes. The furnace is then evacuated to approximately 300 torr and the temperature is increased to about 1350° C. at a rate of about 2° C./min. The furnace is maintained at about 1350° C. for about 10 minutes under vacuum.

The furnace is then allowed to cool from about 1350° C. to about 750° C. with the heaters off while running chilled water through the furnace shell. The cooling rate is between about 10° C. to about 20° C. The furnace is then back-filled with argon to approximately 700 torr and cooled from about 750° C. to room temperature with the furnace shell cooling on and with additional cooling by an internal heat exchanger that cools the argon. The cooling rate is between about 10° C. to about 20° C.

Figure 3:
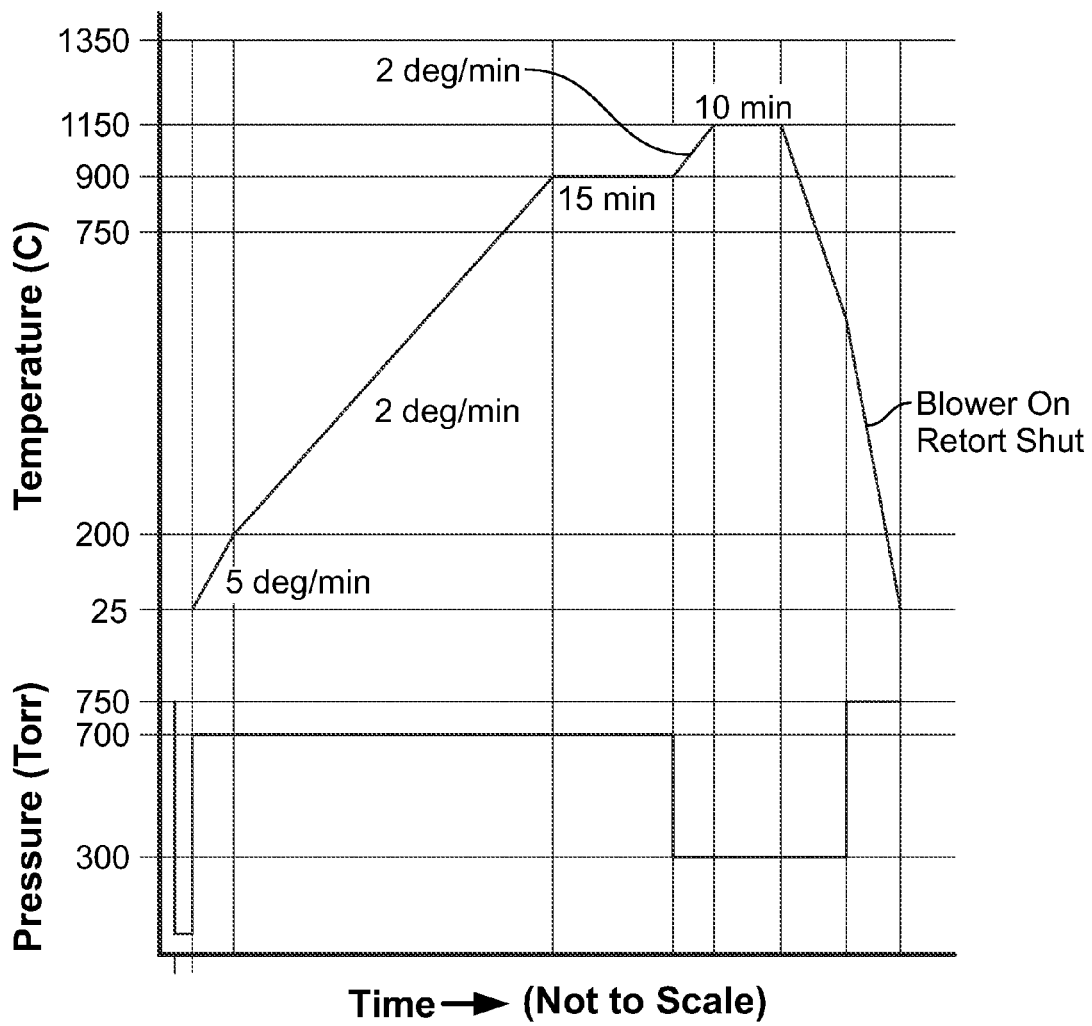
FIG. 3 illustrates an exemplary temperature and pressure profile for a browning process.
Figure 4:
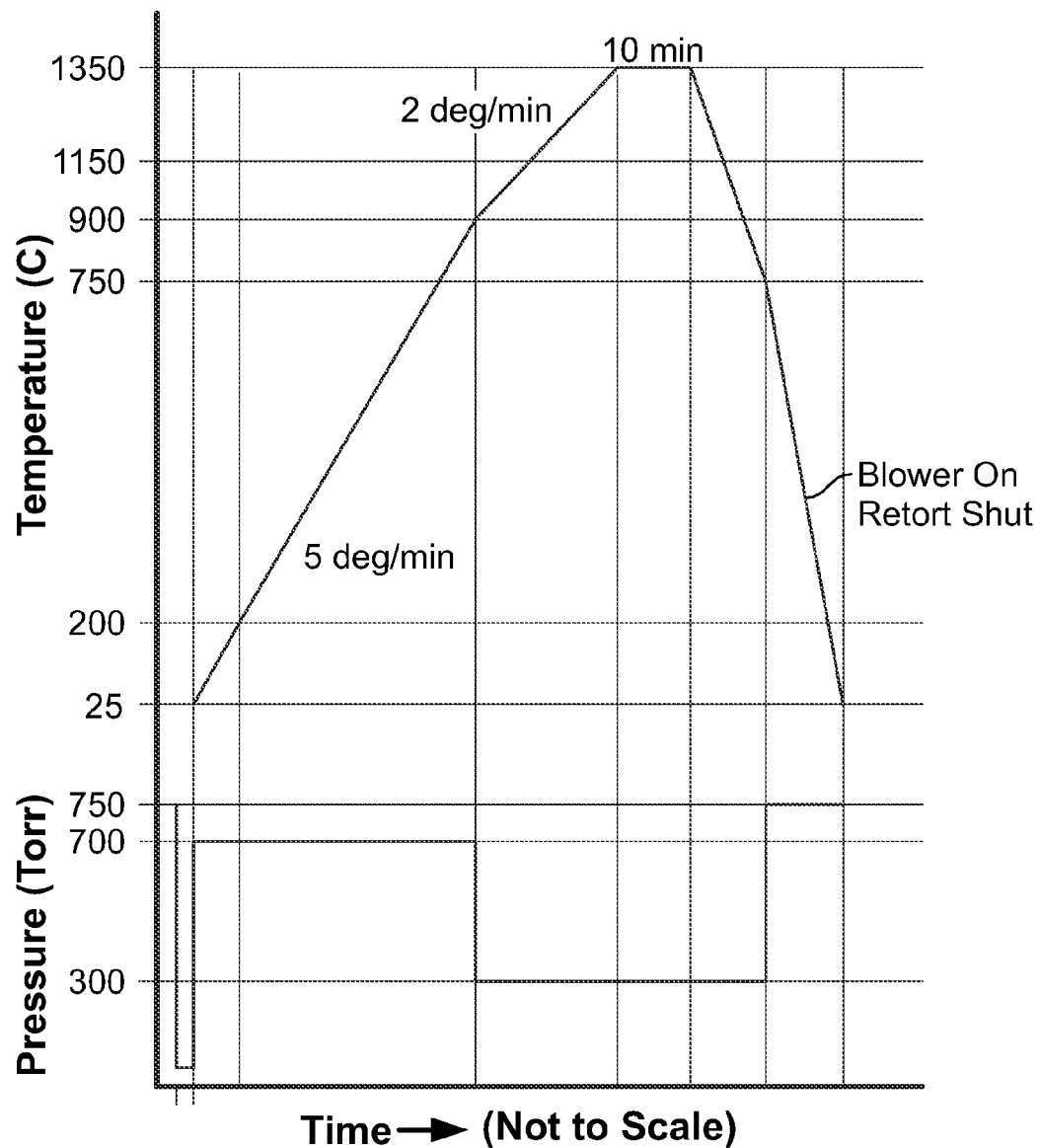
FIG. 4 illustrates an exemplary temperature and pressure profile for a sintering process.

An exemplary dual cycle sintering process is shown in FIGS. 3 and 4. The dual cycle process includes an initial browning process as shown in FIG. 3. The browning process is used to remove the binder from the part 15 to form a brown part. The brown part is then subjected to a sintering process as shown in FIG. 4. The sintering process further sinters and densifies the brown part to form a final part.

The browning process is performed on green parts that may be supported by a support media. The support media may be casting sand, boron-nitride or other ceramic or known media in the art. The support media may be necessary if the binder strength and metal powder characteristics for a given part geometry is not sufficient to prevent the part from slumping during the initial binder removal.

As shown in FIG. 3, the first step includes evacuating the furnace and back-filling with argon to approximately 700 torr. The second step includes heating the furnace to about 200° C. at a rate of about 5° C./min. The third step includes heating from about 200° C. to about 900° C. at a rate of about 2° C./min. The furnace is then maintained at about 900° C. for about 15 minutes. The furnace is then evacuated to approximately 300 torr and the temperature is increased to about 1150° C. at a rate of about 2° C./min. The furnace is maintained at about 1150° C. for about 10 minutes. The furnace temperature is decreased from about 1150° C. to about 750° C. with the heaters off and with the furnace shell heat exchanger running. The cooling rate is between about 10° C. to about 20° C. The furnace is then back-filled with argon to approximately 700 torr and decreased from about 750° C. to room temperature with the furnace shell heat exchanger running, and with additional cooling by an internal heat exchanger that cools the argon. The cooling rate is between about 10° C. to about 20° C.

The brown part may be removed from the furnace at this time to perform secondary operations, or the brown part may be subject to the sintering process in the same furnace used for the browning process. Additionally, the brown part may be removed and processed at a later time.

The formed brown part may be modified prior to the sintering process. The brown part may be machined, drilled or otherwise modified at this brown stage more easily then after the sintering process. After any modification, the brown part is then ready for the sintering process.

The sintering process may be performed on a brown part without the need for support media since the brown part should have sufficient strength not to slump during sintering. In most cases, the presence of a support media at sintering temperatures will contaminate or negatively affect the part characteristics, but there may be cases when the presence of a support media is not harmful to the sintered part.

As shown in FIG. 4, the first step during the sintering step includes evacuating the furnace and back-filling with argon to approximately 700 torr. The second step includes heating the furnace to about 200° C. at a rate of about 5° C./min. The third step includes heating from about 200° C. to about 900° C. at a rage of about 2° C./min. The furnace is then maintained at about 900° C. for about 15 minutes. The furnace is then evacuated to approximately 300 torr and the temperature is increased to about 1350° C. at a rate of 2° C./min. The furnace is maintained at about 1350° C. for about 10 minutes under vacuum.

The furnace is then allowed to cool from about 1350° C. to about 750° C. with the furnace shell heat exchanger on. The cooling rate is between about 10° C. to about 20° C. The furnace is then back-filled with argon to approximately 700 torr and decreased from about 750° C. to room temperature with the furnace shell heat exchanger running, and with additional cooling from an internal heat exchanger cooling the argon. The cooling rate is between about 10° C. to about 20° C. The sintered part is removed from the furnace.

The sintered part may have mechanical secondary operations including machining, drilling, polishing, and surface densification performed thereupon. Additionally, the sintered part may have heat treatments including hot isostatic pressing performed thereupon.

The results of trials performed on parts processed by the single cycle process and the dual cycle process are now discussed. The trials were performed on a powder mixture containing 1.0% ORGASOL® Nylon 12 having an about 4 micron average powder size and a mixture of 17-4PH powder and 17-4PHB powder that provide an overall boron percent in the metal powder of about 1.0%. The 17-4PH powder had a composition including about Cr=17.2%, about Ni=4.1%, about Cu=4.2%, about Nb+Ta=0.37%, about Si=0.4, about Mn=0.3, about C=0.01%, and Fe balance. A variety of part forms including simple flat shapes and shapes exhibiting double support bending, cantilever bending, double shear and tension were produced by SLS and subject to the following processes.

A series of trials were performed using the single cycle process. Furnace trials were performed on both supported and non-supported parts to initially burn-off the binder and complete final sintering. A first group of trials were performed on un-supported shapes. The process was suitable for flat parts, but for more complex shapes, the initial profiles resulted in structural failure during binder burn-off and prior to metal powder bonding.

A second group of single cycle trials were performed on supported shapes. Parts supported in casting sand, ceramic media and boron nitride were found dimensionally unacceptable because of bulging caused by the inability of support media to evacuate cavities that diminish as shrinkage occurs. Parts supported in sand and ceramic media were undesirable also due to deposits from products of reaction at sintering temperature, vitrification of the media, and particles of the media sticking to the sintered part. Reductions in tensile strength and fatigue resistance were noted for parts sintered in sand and boron nitride support media. Chemical analysis of the surface of parts sintered in boron nitride support media revealed that the part surface was enriched in boron from exposure to the boron nitride at the maximum sintering temperatures and is most likely the factor contributing to the reduced fatigue resistance.

A second series of trials were performed using the dual cycle process. Furnace trials were performed only on parts supported during the binder removal brown process. This decision was based on the necessity of support media during the first series of trials to prevent slumping. Different part shapes were processed with the dual cycle process to determine if binder burn-off could be accomplished without slump or deformation during the browning process.

The parts were initially heated in a furnace using the browning process. The binder was removed from the parts and the parts became stable through particle bonding after exposure to temperatures between about 900° C. and about 1150° C. Boron nitride media was used to support the parts in an alumina crucible during the browning cycle. Ceramic and sand media were not used after initial tests showed they produce discoloration from products of reaction at lower temperatures. Test trials showed that browning for 17-4PH alloy is initially considered the material state resulting from exposure to about 1150° C. for about 10 minutes. This point is primarily chosen at the temperature prior to particle phase change, and where small particle bonding is definitely established, but before significant shrinkage begins.

The brown parts in the support media were removed from the furnace and separated from the support media. The brown parts were then placed back in the furnace and heated using the sintering process. The sintered parts were formed without cracking, deformation or slumping. The sintered parts were formed with a substantially pure martensitic structure. The sintered parts were formed with properties as shown in FIG. 5. FIG. 5 also includes the properties of an example sintered part according to the invention. It should be appreciated by one of skill in the art, that instead of the cooling rate being controlled to result in a substantially pure martensitic structure, a part of a mixed martensitic and austenitic structure could initially be formed and then heat treated to form a desired martensitic structure.

Surface shot peening and hot isostatic pressing (HIPping) were performed to determine the effect these post sintering processes have on fatigue resistance and porosity. The residual compressive stress in the surface of shot-peened samples increased the fatigue resistance of the dual cycle processed parts by 180%. The unexpected magnitude of this improvement is thought to be the result of the overlapping material deformation in the part surface.

HIPping resulted in a 74% reduction in fatigue resistance. This was most probably due to a deterioration of the surface as evidenced by discoloration of the surface. HIPping did reduce pore size and the number of recognizable pores by 50% and 25% respectively. However, HIPping will not be a viable post sintering process until advances are made that preclude surface finish deterioration as the primary contributor to crack initiation.

Additional dual cycle trials were performed with varying amount of binder between about 0.5% and about 3.0% at about 0.25% intervals while varying the laser power between about 10 W and about 35 W at about 5 W intervals. These trials determined that about 1.0% binder and about 15 W laser power resulted in optimum characteristics of green strength, detail definition, and final shrinkage after sintering.

Figure 7:
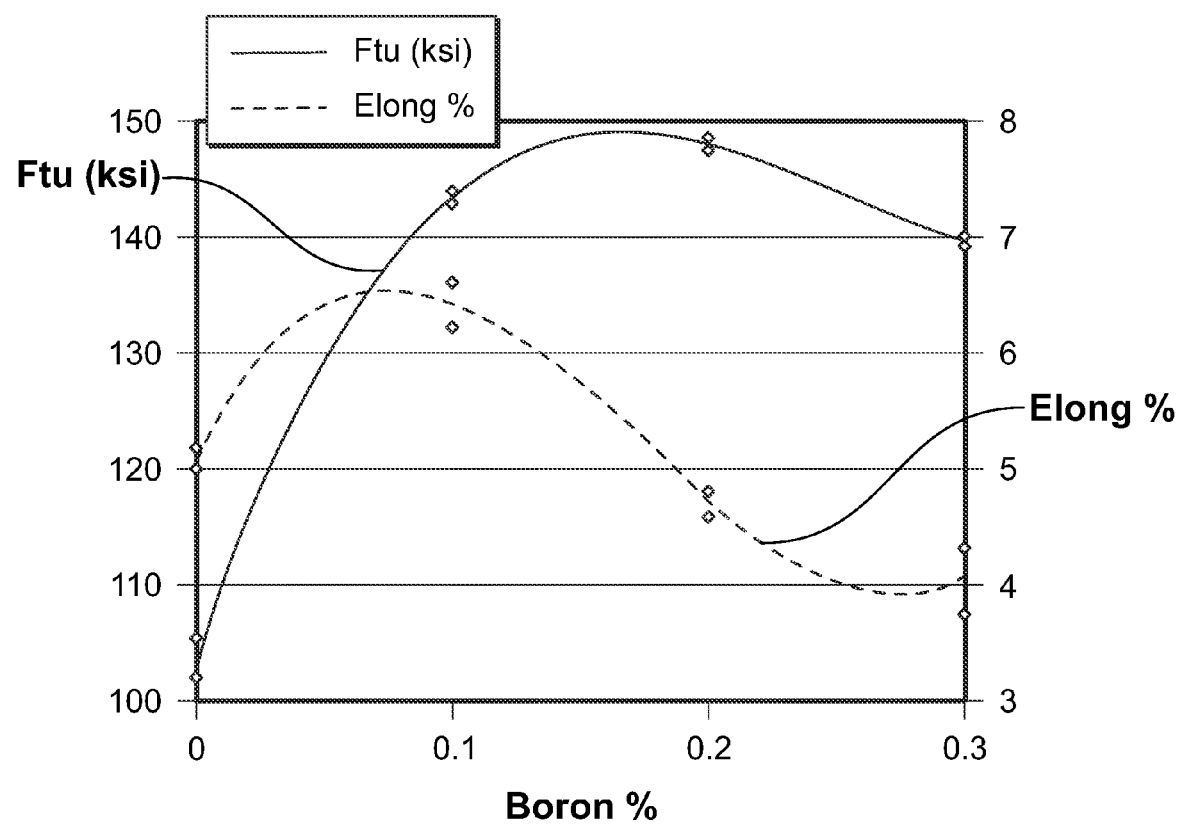
FIG. 7 shows a further comparison of the effect of boron concentration.

Additional trials were performed with about 0%, about 0.2%, about 0.3% boron and about 1.0% binder. Physical characteristics were measured to determine the effect of boron on elongation, tensile strength and fatigue resistance. The results of these trials for elongation and tensile strength are presented in FIG. 6. The characteristics of elongation percent and ultimate tensile stress as measured are graphically presented in FIG. 7. These results indicate an unexpected benefit at about 0.1% boron and about 1% binder concentration. At these amounts, parts with greater than a 6% improvement in elongation and having a greater than 140 ksi ultimate tensile strength were achieved.

Figure 8:
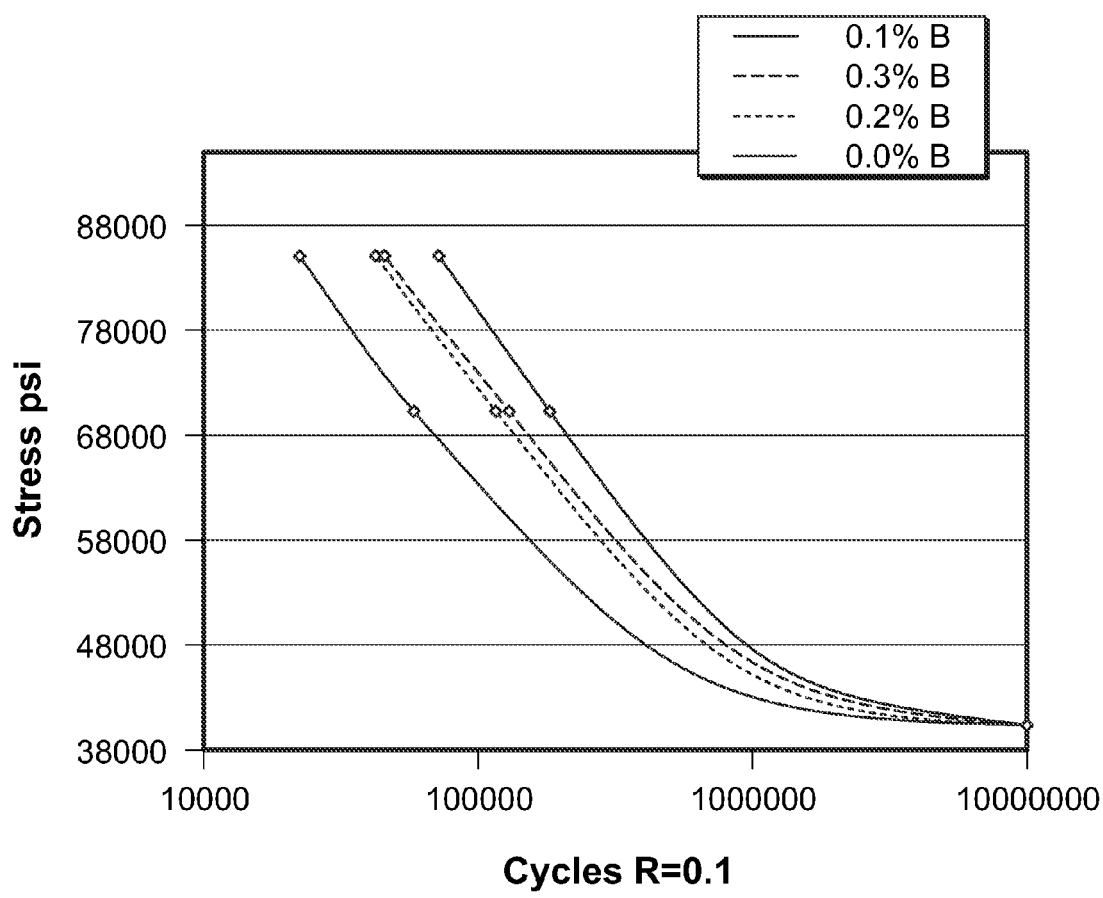
FIG. 8 shows a the effect of boron concentration on cycle life.

Furthermore, these parts were subjected to three levels of alternating stress with a load reversal factor of 0.1 to determine fatigue resistance. The results of these trials are shown in FIG. 8. As can be seen in FIG. 8, an about 0.1% boron addition resulted in improved cycle performance.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method of sintering a powder, comprising:
mixing binder powder and metal powder to form a powder mixture;
selective laser sintering the powder mixture to form a green part comprising a binder constituent;
heating the green part supported by a support media to remove the binder constituent and forming a brown part;
cooling the brown part to ambient temperature;
removing the support media from the brown part; and
sintering the brown part to form a sintered metal part having a substantially pure martensitic structure;
wherein the metal powder comprises 17-4PH alloy powder.

2. The method of claim 1, wherein the metal powder comprises between about 0.1% wt. % and about 0.3% wt. % boron.

3. The method of claim 2, wherein the metal powder comprises about 0.1% wt. % boron.

4. The method of claim 1, wherein the selective laser sintering is performed by a laser having a power in the range of about 10 W to about 35 W.

5. The method of claim 3, wherein the powder mixture comprises about 1.0% binder powder.

6. The method of claim 3, wherein the metal powder has a composition comprising:
15.5-17.5% Cr;
3.5-4.5% Ni;
3.5-4.5% Cu;
0.15-0.45% Cb+Ta;
0-0.5% Mn;
0-0.04 P;
0.07% max C; and
balance Fe.

7. The method of claim 4, wherein the selective laser sintering is performed by a laser having a power of about 15 W.

* * * * *